US009567492B2

(12) United States Patent
Singh et al.

(10) Patent No.: US 9,567,492 B2
(45) Date of Patent: Feb. 14, 2017

(54) POLISHING OF HARD SUBSTRATES WITH SOFT-CORE COMPOSITE PARTICLES

(71) Applicants: SINMAT, INC., Gainesville, FL (US); UNIVERSITY OF FLORIDA RESEARCH FOUNDATION, INC., Gainesville, FL (US)

(72) Inventors: Rajiv K. Singh, Newberry, FL (US); Arul Chakkaravarthi Arjunan, Gainesville, FL (US); Kannan Balasundaram, Gainesville, FL (US); Deepika Singh, Newberry, FL (US); Wei Bai, Gainesville, FL (US)

(73) Assignees: Sinmat, Inc., Gainesville, FL (US); University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 14/471,755

(22) Filed: Aug. 28, 2014

(65) Prior Publication Data

US 2016/0060488 A1     Mar. 3, 2016

(51) Int. Cl.
*C09G 1/04* (2006.01)
*C09K 3/14* (2006.01)
(Continued)

(52) U.S. Cl.
CPC ............... *C09G 1/04* (2013.01); *B24B 37/044* (2013.01); *C09G 1/02* (2013.01); *C09K 3/1436* (2013.01);
(Continued)

(58) Field of Classification Search
CPC ................................ C09G 1/04; B24B 37/044
See application file for complete search history.

(56) References Cited

U.S. PATENT DOCUMENTS 6,740,590 B1 * 5/2004 Yano ..................... C09G 1/02
                                                    257/E21.304
8,557,133 B2   10/2013 Singh et al.
(Continued)

FOREIGN PATENT DOCUMENTS

EP     1036836 A1     9/2000
EP     1717286 A1    11/2006
(Continued)

OTHER PUBLICATIONS

Material Hardness (2001) by CALCE and the University of Maryland posted on "www.calce.umd.edu/TSFA/Hardness_ad_.htm#3.5": (23 pages) Used only as evidence.*
(Continued)

*Primary Examiner* — Duy Deo
*Assistant Examiner* — Mahmoud Dahimene
(74) *Attorney, Agent, or Firm* — Jetter & Associates, P.A.

(57) ABSTRACT

A chemical mechanical polishing (CMP) includes providing a slurry including composite particles dispersed in a water-based carrier that comprise a plurality of hard particles on an outer surface of a soft-core particle. The hard particles have a Mohs hardness at least 1 greater than a Mohs hardness of the soft core particle and/or a Vickers hardness at least 500 Kg/mm$^2$ greater than the soft-core particle. A substrate having a substrate surface with a hardness greater than a Mohs number of 6 or a Vickers hardness greater than 1,000 kg/mm$^2$ is placed into a CMP apparatus having a rotating polishing pad, and CMP is performed with the rotating polishing pad and the slurry to polish the substrate surface.

13 Claims, 11 Drawing Sheets

(51) Int. Cl.
  *C09G 1/02*    (2006.01)
  *C30B 33/00*   (2006.01)
  *H01L 21/306*  (2006.01)
  *H01L 21/02*   (2006.01)
  *B24B 37/04*   (2012.01)

(52) U.S. Cl.
  CPC ............ *C09K 3/1463* (2013.01); *C30B 33/00* (2013.01); *H01L 21/02002* (2013.01); *H01L 21/02024* (2013.01); *H01L 21/30625* (2013.01)

(56) References Cited

U.S. PATENT DOCUMENTS

| | | | |
|---|---|---|---|
| 2004/0192172 A1* | 9/2004 | Towery | B24B 37/04 451/41 |
| 2006/0118760 A1 | 6/2006 | Yang et al. | |
| 2007/0087667 A1* | 4/2007 | Laconto | C09G 1/02 451/41 |
| 2010/0258528 A1 | 10/2010 | Singh et al. | |
| 2014/0124793 A1* | 5/2014 | Singh | H01L 21/30625 257/77 |
| 2015/0004788 A1* | 1/2015 | Shi | H01L 21/30625 438/693 |

FOREIGN PATENT DOCUMENTS

| | | |
|---|---|---|
| KR | 101144839 B1 | 5/2012 |
| WO | 2007041199 A2 | 4/2007 |

OTHER PUBLICATIONS

Publication by "admin Published time" (cerium oxide polishing powder production (2012) found on the internet page http://www.beyondchem.com/en/news/15590.htm.)(7 pages).*

J.F. Shackelford, et al., CRC Materials Science and Engineering Handbook, CRC Press, Boca Raton, FL, 1991, pp. 12-205-12-206. Marj Tiefert, et al., https://en.wikipedia.org/wiki/Isoelectric_point, "Isoelectric Point", pp. 1-4, 1993.

R. G. Munro, "Material Properties of a Sintered α-SiC", J. Phys. Chem. Ref. Data., vol. 26, No. 5, 1997, pp. 1195-1203.

P. Figiel, et al., "Properties of alumina ceramics obtained by conventional and non-conventional methods for sintering ceramics", Journal of Achievements in Materials and Manufacturing Engineering, vol. 48, Issue 1, Sep. 2011, pp. 29-34.

* cited by examiner

| Hard Particle Concentration and average size | Soft particle Concentration and average size | Polisher & Polishing conditions | Additive and pH | Pad | Removal rate in microns/hr | Substrate orientation | Subsurface damage in microns and Roughness RMS in nm |
|---|---|---|---|---|---|---|---|
| 5% Diamond 0.25 micron | None | Single side 4.7 psi/ | None pH 7.4 | Polyurethane | 3.51 | A-plane | 1 micron & 2.5 nm |
| 5% Diamond 0.25 micron | 5 % weight, 0.3 micron alumina | Single side 12 inch platen 4.7 psi/300 rpm | 2% NaOH pH 10.2 | Polyurethane | 9.5 | C-plane | 0.8 micron & 1.0 nm |
| 5%Diamond (1/4) micron | 3 micron alumina, 5% wt. | Single side 12 inch platen 4.7 psi | None pH = 6.4 | Polyurethane | 16.1 | A-plane | 0.5 micron & 2.0 nm |
| 5%Diamond (1/4) micron | 3 micron alumina, 5% wt. | Single side 12 inch platen 4.7 psi/300 rpm | NaOH 4% pH 11.4 | Polyurethane | 26.4 | A-plane | 0.4 micron & 1.8 nm |
| 5%,Diamond (1/4) micron | 3 micron alumina 5% | Single side 24 platen 4.2psi 30 rpm | NaOH 2%, pH 10.3 | Copper composite plate | 15.4 | C-plane | 0.6 micron & 0.7nm |
| 5%Diamond (1/4) micron | None | Single side 24 platen 4.2psi | None pH 7.4 1% Potassium persulfate | Copper composite plate | 6.3 | C-plane | 1 micron & 0.9 nm |
| 3%Diamond (3) micron | None + 5 % colloidal silica | Single side 24 platen 4.2psi | 0.02% KOH pH 7.8 | Copper plate | 10.4 | C-plane | 5 microns & 15 nm |

FIG. 3A

| Hard Particle Concentration and average size | Soft particle Concentration and average size | Polisher & Polishing conditions | Additive and pH | Pad | Removal rate in microns/hr | Substrate orientation | Subsurface damage in microns and Roughness RMS in nm |
|---|---|---|---|---|---|---|---|
| 1.5% Diamond, 4 micron diamond coated with manganese oxide | 9 micron alumina 5%, 5 % colloidal silica | Single side 12 inch platen 4.7 psi/ | 1.5 %NaOH pH = 10.5 | Polyurethane | 35.6 | C-plane | 2 microns & 1.3 nm |
| 1.5% Diamond (0.25 micron) +1.5% Diamond (2-4 micron) | 9 micron alumina coated with MnO2 5% | Single side 12 inch platen 4.7 psi/ | 1.5 % LiOH pH = 10.1 | Polyurethane | 16.2 | C-plane | 4 microns & 2.4 nm |
| 5% Diamond (1/4) micron coated with CuO | 3 micron alumina 5% coated with Titania | Single side 12 inch platen 5 psi/150 rpm | 6% NaOH pH 13.4 | Polyurethane | 17.2 | A-plane | 0.6 micron/0.8 nm |
| 3% Diamond (1/4) micron coated with MnO2 | 3 um diamond alumina 5% + 5 % 100 nm silica . All coated with MnO2 | Single side 12 inch platen 5 psi/ | 1.5 %NaOH pH = 10.6 | Polyurethane | 26.4 | A-plane | 0.6 micron/0.9 nm |
| 3% MnO2 coated Diamond (1/4) micron | 3 micron alumina 5% | Double sided 12 psi/40 rpm | 4% NaOH pH= 11.2 | Poromeric Pore size – 40 micron | 14.0 | A-plane | 0.8 micron/0.9nm (average) |
| 3% Diamond (1/4) micron | 3 micron , 5% alumina, 2 % manganese oxide particles | Single sided 5 psi/ 200 rpms | 4% NaOH pH = 11.3 | Poromeric Pore size 30 microns | 12.0 | A-plane | 0.6 microns/ 0.9 nm |

FIG. 3B

| Primary Particle and average size | Secondary (core) particle and average size | Polisher & Polishing conditions | Additive | Pad | Removal rate in microns/hr | Substrate orientation | Subsurface damage in microns and Roughness RMS in nm |
|---|---|---|---|---|---|---|---|
| 0.1%Diamond (1/4) micron | None | Single side 12 inch platen 4.7 psi/90rpm | - | D100 | 1.2 | Si-face | 0.75 & 1.5 nm |
| 0.1% coated diamond (1/4) micron | | Single side 12 inch platen 4.7 psi/90rpm | 3% KMnO4 | D100 | 3.5 | Si-face | 0.5 micron & 1.0 nm |
| 0.8%Diamond (1/4) micron | | Single side 12 inch platen 4.7 psi/250 rpm | 3% KmnO$_4$ | D100 | 6.75 | Si-face | 0.5 micron & 1.0 nm |
| 0.4 %Diamond (1/4) micron | | Single side 12 inch platen 6.4 psi/150 rpm | 3% KmnO$_4$ | Copper | 4.8 | Si-face | 0.8 micron & 1.0 nm |
| 0.4%Diamond (1) micron | | Single side 12 inch platen 6.4 psi/150 rpm | | D200 | 1.8 | Si-face | 1.2 micron & 1.5 nm |
| 0.4 %Diamond (1/4) micron | - | Single side 12 inch platen 4.7 psi/150 rpm | 3% KmnO$_4$ | D100 | 9.92 | C-face | 0.5micron & 0.8nm |

FIG. 4A

| Primary Particle and average size | Secondary (core) particle and average size | Polisher & Polishing conditions | Additive | Pad | Removal rate in microns/hr | Substrate orientation | Subsurface damage in microns and Roughness RMS in nm |
|---|---|---|---|---|---|---|---|
| | 5 wt% 0.3 micron alumina | Single side 12 inch platen 4.7 psi/150 rpm | 5% K2S2O8 | Politex | 0.21 | Si-face | 0.1 micron & 0.6nm |
| - | 5 wt% 1 micron alumina | Single side 12 inch platen 4.7 psi/150 rpm | 5% K2S2O8 | Politex | 0.2 | Si-face | 0.1 micron & 0.6nm |
| - | 5 wt% 3 micron alumina | Single side 12 inch platen 4.7 psi/150 rpm | 5% K2S2O8 | Politex | 0.22 | Si-face | 0.1 micron & 0.6nm |
| 0.6 %Diamond (1/4) micron | 5% 0.3 micron alumina | Single side 12 inch platen 4.7 psi/120 rpm | - | Politex | 3.1 | Si-face | 0.6 micron & 0.8nm |
| 0.6 %Diamond (1/4) micron | 5% 1 micron alumina | Single side 12 inch platen 4.7 psi/150 rpm | - | Politex | 6.23 | Si-face | 0.6 micron & 0.8nm |
| 0.6 %Diamond (1/4) micron | 5% 3 micron alumina | Single side 12 inch platen 4.7 psi/120 rpm | - | Politex | 9.58 | Si-face | 0.6 micron & 0.8nm |
| 0.6 %Diamond (1/4) micron | 5% 5 micron alumina | Single side 12 inch platen 4.7 psi/120 rpm | - | Politex | 11.48 | Si-face | 0.8 micron & 0.6nm |

FIG. 4B

| Primary Particle and average size | Secondary (core) particle and average size | Polisher & Polishing conditions | Additive | Pad | Removal rate in microns/hr | Substrate orientation | Subsurface damage in microns and Roughness RMS in nm |
|---|---|---|---|---|---|---|---|
| 0.4 %Diamond (1/4) micron | 3% Alumina 300nm | Single side 12 inch platen 4.7 psi/250 rpm | 5.4% $K_2S_2O_8$ | Politex | 13.5 | Si-face | 0.5 microns & 1 nm |
| 0.4 %Diamond (1/4) micron | 9 micron calcined alumina 5% | Single side 12 inch platen 4.7 psi/300 rpm | 5.4% $K_2S_2O_8$ | Politex | 17.5 | Si-face | 0.8 microns & 1.3 nm |
| 0.4 %Diamond (1/4) micron | 3 micron calcined alumina 5% | Single side 12 inch platen 4.7 psi/300 rpm | 5.4% $K_2S_2O_8$ | DC100 | 12.4 | Si-face | 0.8 microns & 1.3 nm |
| 0.4 %Diamond (1/4) micron | 3 micron calcined alumina 5% | Single side 12 inch platen 4.7 psi/300 rpm | | DC100 | 10.2 | Si-face | 0.8 microns & 1.3 nm |
| 0.4 %Diamond (1/4) micron | 3micron calcined alumina 5% | Single side 12 inch platen 4.7 psi/300 rpm | Sodium Dodecyl sulpate | Politex | 13 | Si-face | 0.8 microns & 1.3 nm |
| 3% Diamond (1/4) micron | 3 micron alumina 5% | Double sided 19 inch platen 45lbs psi/40 rpm | 4% NaOH | D100 | 12 | Si-face | 0.8 microns & 1.3 nm |
| 3% Diamond (1/4) micron | 3 micron alumina 5% | Double sided 19 inch platen 45lbs psi/40 rpm | 4% NaOH | D100 | 18 | C-face | 0.8 microns & 1.3 nm |
| 1% Diamond (1/4) micron | | Single side 12 inch platen 4.7 psi/120 rpm | - | D100 | 1.2 | Ga-face | 1,0 micron & 1.5 nm |

FIG. 4C

| Hard Particle and average size | Soft Particle and average size | pH | Additive | Materials | ER | APR | SSD | Dispersability |
|---|---|---|---|---|---|---|---|---|
| 0.25, 5% μm diamond | none | 7 | none | SiC (poly) | 1.0 | 1.3 | 2μm | 6 |
| 0.25, 5% μm diamond | 3 μm alumina | 7 | none | SiC (poly) | 2.62.6 | 1.2 | 1.9 μm | 5 |
| 0.25, 5% μm diamond | 10 μm alumina | 7 | none | SiC (poly) | 2.9 | 1.2 | 2.2 μm | 4 |
| 0.25, 5% μm diamond | 3 μm alumina | 2 | 0.2 M $KMnO_4$ | SiC (poly) | 4.6 | 12.5 | 1.4 μm | 5 |
| 0.25, 5% μm diamond | 3 μm alumina | 2 | 1 M Mn | SiC (poly) | 5.1 | 14.5 | 1.4 μm | 5 |
| 0.25, 5% μm diamond | 3 μm alumina | 2 | 0.2 M Mn | SiC (poly) | 3.2 | 1.9 | 1.4 μm | 5 |
| 0.25, 5% μm diamond | 3 μm alumina | 2 | 1.1 M Mn | SiC (poly) | 3.7 | 2.1 | 1.4 μm | 5 |

FIG. 5A

| Hard Particle and average size | Soft Particle and average size | pH | Additive | Materials | ER | APR | SSD | Dispersability |
|---|---|---|---|---|---|---|---|---|
| 0.25, 5% μm diamond Coated with MnO2 | 3 μm alumina Coated with MnO2 | 2 | 0.2 M Mn | SiC (poly) | 4.3 | 11.6 | 1.4 μm | 9 |
| 0.25, 5% μm diamond Coated with MnO2 | 3 μm alumina Coated with MnO2 | 2 | 0.2 M Mn | SiC (poly) | 3.1 | 1.5 | 1.4 μm | 9 |
| 0.005, 1% μm diamond coated with MNo2 | 3 μm alumina Coated with MnO2 | 2 | 0.2 M Mn | SiC (poly) | 10.6 | 13.4 | 0.8 μm | 10 |
| 5 micron1% diamond | 3 μm alumina Coated with MnO2 | 2 | 0.2 M Mn | SiC (poly) | 2.4 | 3.6 | 4.0 μm | 3 |
| 0.12 micron 1% diamond coated with MnO2 | none | 2 | 0.2 M Mn | SiC (poly) | 9.4 | 3.0 | 0.7 μm | 10 |

FIG. 5B

| Hard Particle and average size | Soft Particle and average size | pH | Additive | Materials | ER | APR | SSD | Dispersability |
|---|---|---|---|---|---|---|---|---|
| 0.25 micron 5%diamond coated with MnO2 | 3 μm alumina Coated with MnO2 | 2 | 0.2 M Mn | GaN (poly) | 3.7 | 4.8 | 1.8 μm | 9 |
| 0.25 micron 5%diamond coated with MnO2 | 3 μm alumina Coated with MnO2 | 2 | 0.2 M Mn | GaN (poly) | 2.1 | 1.5 | 1.7 μm | 9 |
| 0.25 micron 5%diamond coated with MnO2 | 3 μm alumina Coated with MnO2 | 2 | 0.2 M Mn | diamond (polyl) | 8.4 | - | 0.7 μm | 9 |
| 0.25 micron 5%diamond coated with MnO2 | 3 μm alumina Coated with MnO2 | 2 | 0.2 M Mn | diamond/cobalt | 2.5 | 1.5 | 1.7 μm | 9 |
| 0.25 micron 5%diamond coated with MnO2 | 3 μm alumina Coated with MnO2 | 2 | 0.2 M Mn | diamond/SiC | 2.5 | 1.5 | 1.7 μm | 9 |

FIG. 5C

| Hard Particle and average size | Soft Particle and average size | pH | Additive | Materials | ER | APR | SSD | Dispersability |
|---|---|---|---|---|---|---|---|---|
| 0.25, 5% μm diamond | 3 μm Alumina | 1.5 | none | Poly Diamond/SiC | 1.0 | 1.3 | 2 μm | 6 |
| 0.25, 5% μm diamond | μm Alumina | 1.5 | none | Poly Diamond/Cobalt | 1.0 | 1.3 | 2 μm | 6 |

FIG. 6

POLISHING OF HARD SUBSTRATES WITH SOFT-CORE COMPOSITE PARTICLES

FIELD

Disclosed embodiments relate to slurries and methods of chemical mechanical polishing or chemical mechanical planarization (CMP) for polishing substrates.

BACKGROUND

CMP is a common method to planarize substrates. CMP utilizes a slurry generally including water, an oxidizer and particles for selective removal of material from substrates. In conventional CMP, a substrate carrier or polishing head is mounted on a carrier assembly and positioned in contact with a polishing pad in a CMP apparatus. The carrier assembly provides a controllable pressure to the substrate pressing the substrate against the polishing pad. The pad is moved relative to the substrate.

Hard slurry particles such as diamond, cubic boron nitride, silicon carbide, and boron carbide, are routinely applied to polish hard substrates using a mechanical polishing process such as lapping and grinding. The size of the particles typically controls the polishing rate, where the larger the particle size the higher the polishing rate. However, larger particles also cause higher surface and sub-surface damage, so that mechanical polishing processes may employ multiple steps. For example, initially larger sized particles can be used in earlier CMP step(s) followed by smaller and smaller size particles in later CMP step(s) in an attempt to improve the removal rate and the surface finish. Typically such large hard particles are not used in CMP processes as they can induce a high degree of damage during the polishing processes.

SUMMARY

This Summary briefly indicates the nature and substance of this Disclosure. It is submitted with the understanding that it will not be used to interpret or limit the scope or meaning of the claims.

Disclosed embodiments relate to CMP of relatively hard substrate materials, such as sapphire, alumina (e.g. sapphire), zirconia, quartz, diamond, carbides and nitrides, generally having a Vickers hardness greater than 1000 kg/mm$^2$ and/or a Mohs hardness greater than 6. Disclosed embodiments employ a synergistic combination of particles by providing composite particles each including a plurality of hard particles on a soft-core particle, along with optional added chemistries, which have been found to increase the removal rate of various hard substrate materials during CMP while minimizing the surface and sub-surface damage of the substrate surface of the substrate material.

BRIEF DESCRIPTION OF THE DRAWINGS

FIGS. 3A and 3B are tables which lists results from Example 1.

FIGS. 4A, 4B and 4C are tables which lists results from Example 2.

FIGS. 5A, 5B and 5C are tables which lists results from Example 3.

FIG. 6 is a table which lists results from Example 4.

DETAILED DESCRIPTION

Figure 1:
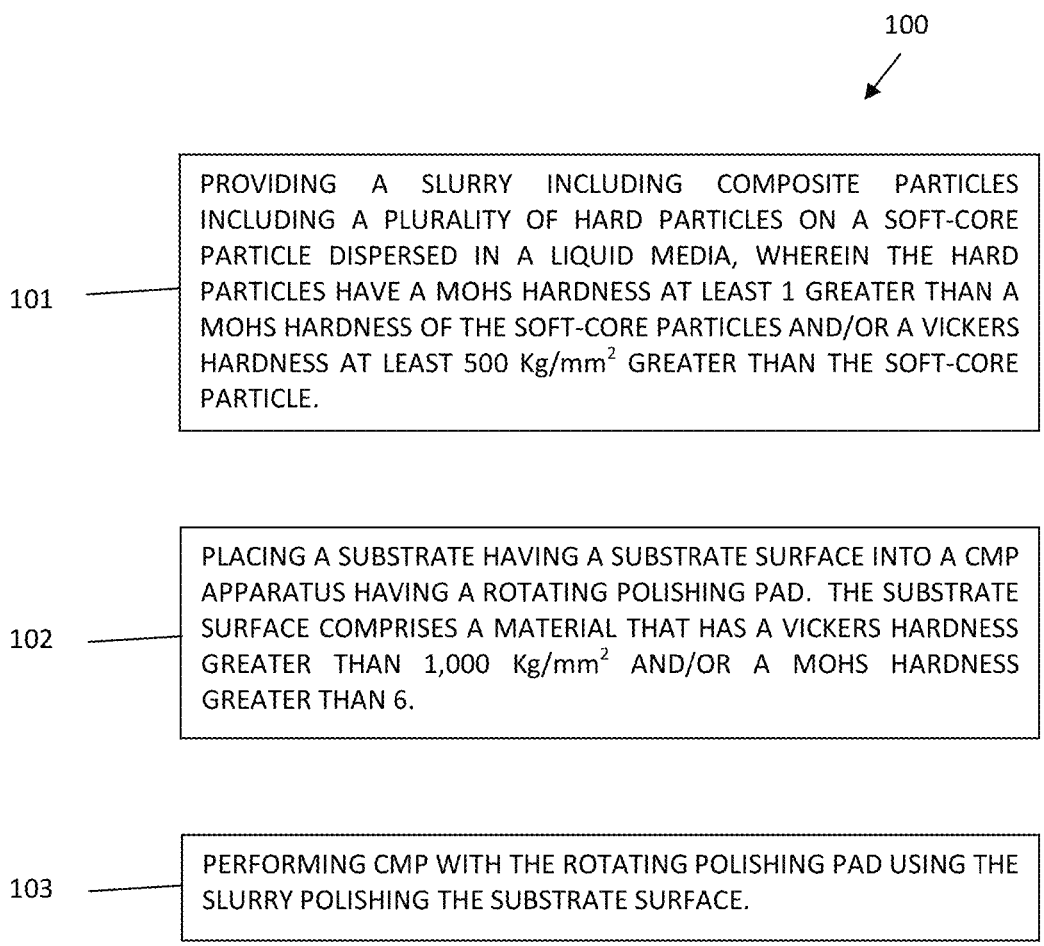
FIG. 1 is a flow chart that shows steps in an example CMP method for polishing a surface of a substrate using a slurry including composite particles comprising a plurality of hard particles on a soft-core particle, according to an example embodiment.

Embodiments of the invention are described with reference to the attached figures, wherein like reference numerals are used throughout the figures to designate similar or equivalent elements. The figures are not drawn to scale and they are provided merely to illustrate certain features. Several aspects of this Disclosure are described below with reference to example applications for illustration.

It should be understood that numerous specific details, relationships, and methods are set forth to provide a full understanding of the subject matter in this Disclosure. One having ordinary skill in the relevant art, however, will readily recognize that embodiments of the invention can be practiced without one or more of the specific details or with other methods. In other instances, well-known structures or operations are not shown in detail to avoid obscuring subject matter. Embodiments of the invention are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

One goal for a typical polishing CMP process is to have a high removal rate while minimizing both surface and sub-surface damage. As described above, to remove prior crystal damage, or to achieve planarization, the surface of hard materials are conventionally polished with a slurry including hard particles. As the particle size and hardness increases, typically the removal rate increases, however the surface and sub-surface damage increases. Thus a series of successive CMP steps are generally needed, each successive CMP step using a smaller hard particle size to achieve the necessary finish on the hard substrate. It is thus it is desirable to find a slurry for polishing hard materials that provides a high polishing rate without increasing the surface or sub-surface damage.

FIG. 1 is a flow chart that shows steps in an example CMP method 100 for polishing the surface of a hard substrate using a slurry including composite particles having a plurality of hard particles on a soft-core particle, according to an example embodiment. Step 101 comprises providing a slurry including composite particles including a plurality of hard particles on a soft-core particle dispersed in a liquid media, wherein the hard particles have a Mohs hardness at least 1 greater than a Mohs hardness of the soft-core particles and/or a Vickers hardness at least 500 Kg/mm$^2$ greater than the soft-core particle. In a typical embodiment the hard particles have a Mohs hardness at least 2 greater than a Mohs hardness of the soft-core particles or a Vickers hardness of at least 1,000 Kg/mm$^2$ greater than the soft-core particles.

The liquid media is generally a water-based solvent, and can include an organic solvent such as alcohol, glycol, or glycerin. Step 102 comprises placing a substrate having a substrate surface (e.g., sapphire) into a CMP apparatus having a rotating polishing pad. The substrate surface comprises a material that has a Vickers hardness greater than 1,000 Kg/mm$^2$ and/or a Mohs hardness greater than 6. Step 103 comprises performing CMP with the rotating polishing pad using the slurry polishing the substrate surface.

Examples of such substrate materials include sapphire, diamond silicon carbide, aluminum oxynitride, diamond, (AlON), quartz, gallium nitride, zirconia and other oxides. The substrate material can be single crystal or poly-crystalline, and can have more than one phase. The substrate material can be in the form of an epitaxial layer, or comprise a bulk substrate single crystal.

Examples of single crystal materials with Knoop hardness exceeding 2,000 Kg/mm$^2$ include diamond, sapphire, silicon carbide, aluminum nitride, boron nitride, quartz, and gallium nitride and zirconia. Examples of polycrystalline materials include, diamond, silicon carbide, gallium nitride, aluminum nitride, zirconia and sapphire. Examples of amorphous hard substrate materials include, glass, alumina etc. Examples of multiphase substrate materials where at least one of the phases corresponds to a hard material include cobalt/WC, diamond/cobalt, diamond/SiC, silicon/silicon carbide. In all these cases at least one of the phases has hardness greater than 1000 Kg/mm$^2$. The average grain size of the polycrystalline phase generally varies from 1 nm to 1 mm.

If the hard particle is diamond, some examples of soft-core particles include alumina, quartz, boron carbide, boron nitride, silica, silicon carbide. If the hard particle is alumina, examples of soft-core particles are quartz, silica and titania. The average size of the hard particles can generally vary from 1 nm to 200 µm, while the size of the soft-core particles can vary from 10 nm to 200 µm.

The weight fraction of the soft-core particles to hard particles can vary from 0.01 to 100, while the size fraction of the soft-core particles to hard particles can vary from 0.01 to 100. The concentration of composite particles can vary from 0.01 weight percent to 50 percent in the slurry. In one embodiment the composite particles comprising of hard particles and soft-core particles have different iso-electric points (IEP) with an IEP difference of at least 1.0. Examples of particles with high IEP (i.e., >8.0) include alumina, zinc oxide. Examples of particles with medium IEP (i.e., IEP 4.0 to 8.0) include diamond, silicon nitride, and titania. Examples of particles with low IEP include (i.e., IEP less than 3.0) include silica. For example, the diamond particles can be mixed with either silica or alumina which will result in an IEP difference of at least 1.0. Furthermore the average size of the hard particles should generally be smaller than the soft-core particles. This allows the hard particles to more easily cover the soft-core particle surface.

Figure 2:
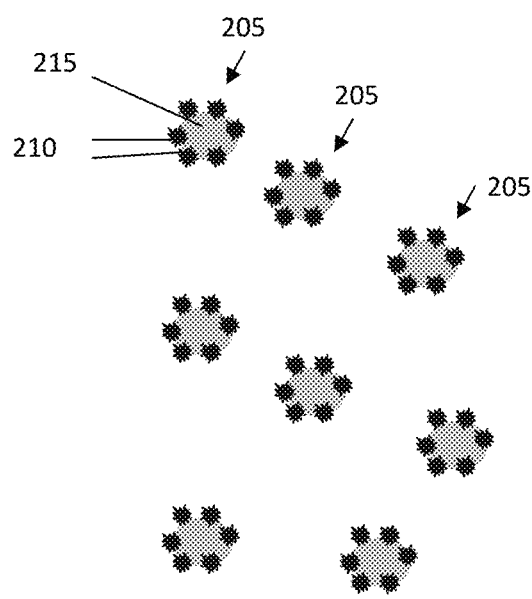
FIG. 2 depicts a plurality of composite particles each including a plurality of hard particles on a soft-core particle, according to an example embodiment.

The mixture of composite particles in the slurry can be used to form composite particles with the hard particle coating on the soft-core particle, such as depicted in FIG. 2 which shows a plurality of composite particles 205 each including a plurality of hard particles 210 on a soft-core particle 215, according to an example embodiment. The coating can be performed in gaseous, aqueous or in organic solvents. Example of composite particles includes diamond particles on alumina, silicon carbide or silica particles. Other examples of composite particles is boron nitride particles coated on alumina or silica. The hard particles on the soft-particle can be physically bonded together by the difference in electrostatic charge.

By coating hard particles onto soft-core particles, the "virtual size" of the hard particle can be increased. As use herein, the "average size" of a particle refers to an average value based on a volume or weight distribution of the particle size distribution. For such a formation process, the hard particle generally have a smaller size as compared to the softer core particle, such as the average size of the hard particles being <1 µm, and the average size of the soft-core particles being >0.05 µm. The hard particles should generally be less than 500 nm, less than 200 nm or less than 50 nm to 1 nm in average size. The average size of the soft-core particles can exceed 200 nm or exceed 1 micron or 5 micron. Slurries including disclosed composite particles have been unexpectedly found to give rise to high polishing rates for a variety of hard substrate materials as compared to a slurry having the same hard particles as the only slurry particles. Furthermore, slurries including disclosed composite particles have been found to give rise to lower surface and sub-surface damage to the substrate.

Another disclosed aspect is the use of coatings on the soft-core particles and/or hard particles. For example, a transition metal oxide/nitride/carbide coatings can be applied onto the hard particles and/or soft-core particles. Examples of transitions metals include, but are not limited to, Fe, Ti, Mn, and Cu. The thickness of the coatings can vary from 0.1 nm to 5000 nm. The use of such coatings has been found to help in increasing the chemical action of the slurry and the dispersability and the stability of the slurry.

Coatings include oxides of manganese and copper on diamond, silicon carbide, boron carbide, boron nitride, alumina, and silica particles. Another aspect is the addition to metallic oxide particles to the disclosed composite particles. Examples of metallic oxide particles include Ti, Cu, Fe, Mg, and Mn. The ratio of metallic oxide particles to disclosed composite particles vary from 1:100 to 1:1 by weight. This means if there is 10 gm/liter of composite particles in the slurry, the metallic oxide particle concentration can vary from 0.1 gm/liter to 10 gm/liter.

In one embodiment the hard particle material is diamond. The hard diamond particles can either be mono crystalline diamond, polycrystalline diamond or nano diamond with average crystallite grain size less than 100 nm. The average crystallite grain size can be less than 50 nm or less than 5 nm. The average diamond particle size can vary from 1 nm to 500 microns. The average size of diamond particles can be less than 5 microns, less than 1 micron, less than 500 nm, less than 200 nm, less than 50 nm, or less than 10 nm. In one particular embodiment the slurry includes an oxidizer that comprises a per-based compound, the plurality of hard particles comprise diamond particles with having an average size <1 µm, and a pH of the slurry is <7.0. In another embodiment, the slurry includes a plurality of hard particles comprising diamond with an average size between 1 nm to 1 micron with a pH>9.0.

The particle size distribution (PSD) for the hard particles can be either narrow or broad. The PSD can be defined by its polydispersity index (PI) given by (d90–d10)/d50×100, where d10 represents size at 10 percentile (by volume) while d50 and d90 represent size at the 50 percentile and 90 percentile, respectively. The smaller the value of PI the narrower is the PSD. The PI index of the hard particle can vary between 5% and 350%, such as a PI index between 20% and 180%. A significant advantage of using composite particles for polishing of hard materials is that broad distribution of hard particles (PI>30%) can be used without a significant decrease in performance (i.e., removal rate surface finish and sub-surface damage), particularly when the hard particles have an average size less than 1 micron.

The polishing pad for the process can comprise of a soft pad material defined herein as a Mohs hardness less than 6 or Vickers Hardness less than 900 Kg/mm$^2$ or a pad embedded with hard particles such as diamond. Examples of soft pads materials include polymeric pads, metallic pads such as copper, tin or iron-like materials. Examples of soft pad materials include polymeric-like pads such as the IC series and Suba Series manufactured by Dow Chemical Company. Regarding the polishing pad material, any type of polymer-based polishing pad can generally be used. Examples of polishing pads are based on polyurethane pads, and suede pads. The pad thickness can vary from 0.1 mm to 25 mm. The hardness of the suede pads can vary from Asker C hardness of 5 to Asker Hardness of 100. The compressibility of the suede pad can from 0.1% to 40 percent. The pore size of the suede poromeric pads can vary from 2 microns to 200 microns with the size in the range of 20 to 60 microns in one embodiment.

Besides the use of poromeric suede pads, polyurethane based pads can also be used. Examples of polyurethane-based pads include D-100 pads from Cabot Microelectronics, IC and Suba Series from Dow Electronics Materials and DC-100 pads from Fujibo Corporation. The hardness of these pads range from Shore D value of 5 to 99. The porosity of such pads can vary from 0.1 percent to 40 percent. Generally any other type of polymeric material can be used with disclosed slurries. Besides the use of polymeric pads, metal pads (such as cast iron, copper, and tin), granite or resin surfaces can be also used as pads. Pads can also comprise a composite of polymer and diamond powder impregnated resin. In addition pads can comprise of hard particles such as diamond, cubic boron nitride impregnated in a metal or resin or polyurethane. The size of the hard particles in the pad can generally vary from 10 nm to 100 microns.

Optionally the slurry can include additives such as ions, alkali metals, pH modifiers, oxidizers, corrosion inhibitors, pH buffering agents, or other additives. The pH of the slurry can generally vary from 0 to 14.0, such as a pH of 9 or greater (e.g., 9 to 14) or a pH lower than 4 (e.g., 0.01-4). Disclosed composite particles mixed with oxidizers increase the removal rates by tribochemical action which results in enhanced removal rates. The tribochemical action can be enhanced by the use of oxidizers and pH. The alkaline pH can be modified by using alkali metal hydroxides such as NaOH, KOH, and ammonium hydroxide. The concentration of the pH changing agents can vary from 0.1 gm per liter to 100 grams per liter. The concentration of acidic pH modifying agents such as acids (nitric, sulfuric, hydrochloric, etc.) can vary from 0.05 gm/liter to 100 gm/liter.

The oxidizing agent can comprise a per-compound, hydrogen peroxide, ammonium cerium nitrate, periodates, periodic acid, iodates, persulfates, chromates, permanganates, ferricyanides, bromates, perbromates, ferrates, perrhenates, and perruthenates. In one specific embodiment, the oxidizing agent comprises a water-soluble transition metal compound that provides transition metal ions, such as Mn. Examples of water soluble transition metal-based oxidizers include permanganates, such as $KMnO_4$. As known in the chemical arts, permanganate is the general name for a chemical compound containing the manganate (VII) ion, ($MnO_4$—). Ferricyanides are another class of water soluble transition metal compounds. As known in the chemical arts, ferricyanide is the anion $[Fe(CN)_6]_3$—.

One significant aspect in polishing of polycrystalline and multi-phase substrate materials that is recognized herein is anisotropy in polishing rates with respect to orientation of the crystal as the chemical reaction is different in different materials orientation, different oxidizers have a different rate of reaction with different material faces and orientations of the crystal. This will generally lead to non-planar polishing. The anisotropy of the polishing rate can be measured by comparing the ratios of polishing for two different planes (e.g., Si face and C face in SiC, GaN face and N face in GaN, c plane and A plane in sapphire, (100) and (111) face in diamond).

The isotropy ratio of these removal rates if it exceeds 20 may be considered to be highly anisotropic. A process for polishing polycrystalline substrate materials can comprise a slurry including composite particles comprising at least 1 hard phase (Vickers hardness greater than 1000 kg/mm$^2$ and/or Mohs hardness greater than 6 where the isotropy ratio is less than 20, and such as less than 10 or less than 5, on a soft-core particle. This can be achieved by using per-based oxidizers with disclosed composite particles within a pH range from 0.01 to 14.0, such as in a pH range from 0.1 and 4 or from 9 to 13.9.

It is also generally desirable to ensure that the composite particles do not agglomerate when dispersed in the liquid media. It has been found that slurry stability can generally be improved by adding a surfactant because surfactant covered particles are recognized to repel one another and as a result tend not to agglomerate. As used herein, the "surfactant" refers to a material having both a lipophilic component and a hydrophilic component, and includes surface active polymers. As known in the art, surfactants are generally classified by the presence of formally charged groups in its head, with non-ionic, cationic, anionic, and cationic surfactants. If a surfactant contains a head with two oppositely charged groups, it is termed zwitterionic. All surfactant types can generally be used with disclosed embodiments.

The concentration of surfactants used in disclosed slurries depends on the type of the surfactant used, the surfaces of slurry particles and the substrate material being polished. At low concentrations, the surfactant may adsorb onto the solid surfaces in a patchy manner and change the electrostatic properties and the surface energy of the surface. The adsorption of the surfactant under these conditions may reduce the polishing rate of the substrate surface. At higher concentrations of surfactant, the surfactant molecules may coalesce together to form self-assembled structures. Examples of structured surfactants can include spheres, cylindrical rods, bi-layers, disks and vesicles. Once the bulk critical micelle concentration (CMC) of surfactant is reached, the surface tension of the solution does not generally decrease any further, but is accompanied by a rapid drop in the electrical conductivity of the bulk solution. The surfactant concentration is generally at least 0.0001 of the CMC for non-ionic surfactants and at least 0.001 CMC for cationic and anionic and zwitterionic.

The slurry can include salts such as alkali ions (e.g., Na, K) in a concentration 0.01 gm/liter to 200 gm/liter. For example, sodium hydroxide or a sodium salt can be added to the slurry.

It is noted that the composite particle slurries disclosed herein are applicable to polishing hard materials that have a Vickers hardness greater than 1,000 Kg/mm$^2$, such a diamond, carbides, oxides, nitrides which have a Vickers hardness greater than 1,500 Kg/mm². The increase in removal rate is generally either due to chemical effects or composite particle effects, or both, and are generally more applicable to such hard materials. The polishing of softer materials using composite particle slurries is not generally as useful as softer materials already have high relative intrinsic polishing rates.

EXAMPLES

Disclosed embodiments are further illustrated by the following specific Examples, which should not be construed as limiting the scope or content of this Disclosure in any way.

Example 1

Sapphire Polishing with Slurries Including Composite Particles

Polishing experiments were conducted on a Buehler Rotopol single sided or PR Hoffmann double sided polisher. The hard particles were diamond, with a particle size varying from 4 nm to 20 μms. The hard particles used also included metal oxide (copper oxide or manganese oxide) coated diamond particles with a coating thickness varying from 1 nm to 10 microns, which can be continuous or discontinuous. The soft-core particles were either alumina (alpha, beta or gamma alumina), silica, silicon carbide, nitride or metallic oxide particles. A minimum Vickers hardness difference of 500 Kg/mm² was between the hard particles and the soft-core particles.

The soft-core particles tested included soft-core particles coated with a metallic oxide compound comprising copper oxide or manganese oxide. The size of the soft-core particles varied from 5 nm to 20 microns. The thickness of the metallic oxide coatings varied from 5 nm to 20 microns, which can be continuous or discontinuous. More than 2 types of soft-core particles can be used together in the slurry.

The liquid carrier for the particles was water. The pH of the slurry of was varied from 1.2 to 14.0. An alkaline pH was obtained by including LiOH, NaOH, KOH or NH₄OH. The alkali salt concentration (potassium persulfate used as an example) when used was varied from 0.01 weight percent to 10 weight percent.

The sapphire substrates polished were either a-plane, c-plane or r-plane substrates. Sapphire substrates with a mis-cut angle up to 10 degrees were used. Other oxide substrates such as AlON and quartz can also be polished using disclosed slurries. The polishing pressure was varied from 1 psi to 20 psi. The linear velocity was varied from 0.1 m/s to 5 m/s. A polymeric or metallic pad was used for polishing. The polymeric pad can comprise polyurethane or poromeric surface with a compressibility varying from 0.1% to 10% and a Shore D hardness varying from 5 to 99. The metallic pad can comprise cast iron, copper, tin, a copper or a polymer composite.

Slurries including disclosed composite particles where at least one of the hard particles and soft-core particles include coatings provides several significant advantages. From a polishing perspective it is desirable to have a high polishing rate, a low roughness surface, low sub-surface damage and high dispersion of the slurries.

To quantify the change in CMP removal rate due to use of slurries including disclosed composite particles on soft-core particles with the option of addition of additives, an enhancement ratio (ER) was computed. The term "ER" is defined herein as the ratio of removal rate for a given substrate composition using a slurry having a liquid media including disclosed composite particles compared to a slurry with the same liquid media containing the same type and concentration of hard particles only. By using diamond hard particles (both metal oxide coated and uncoated) and soft-core silica or alumina particles on the ER value has been found to be increased from 1.2 to 15 for a-plane and c-plane sapphire polishing. For example the addition of 3 micron alumina soft-core particles to 0.25 micron diamond particles has been found to lead to an increase in ER value to approximately 4.5 for polishing A-plane sapphire substrates. Furthermore there was a decrease in sub-surface damage and decrease in surface roughness.

Moreover, the addition of sodium hydroxide was used to increase the pH to above 11.2 which was found to increase the ER value to approximately 7.5. The addition of additives comprising alkali bases (e.g., sodium hydroxide) or alkali salts (e.g., potassium persulfate) which provides alkali ions was also found to reduce the surface roughness and sub-surface damage. Similar improvements were obtained when hard particles (diamond) and soft-core particles (alumina and silica) were coated with metallic oxides such as manganese oxide. One aspect of using metal oxide coated soft-core and hard particles was much higher dispersability of the composite particles in the slurry with a further decrease in surface roughness being obtained.

The ER value was also found to increase when alkali pH chemistry was added to the hard particle slurry. For example if 2% by weight sodium hydroxide was added, to 2%, 0.12 micron uncoated and metal oxide coated diamond particles, the ER value was found to increase from 1 to between 3.5 to 4.0 when polishing A-plane sapphire substrates with a decrease in roughness and sub-surface damage. Furthermore the manganese oxide coated diamond particles showed significantly better dispersability and surface scratches. FIGS. 3A and 3B are tables which lists results from Example 1.

Example 2

Polishing of Single Crystal Silicon Carbide and GaN

Single crystal SiC and GaN and diamond were polished on a single sided Buehler Rotopol polisher. The hard particles in the slurry were diamond, with an average particle size varying from 4 nm to 20 microns. The hard particles tested also included metal oxide coated diamond particles with a coating thickness varying from 1 nm to 10 microns, which can be continuous or discontinuous. The soft-core particles were either alumina (alpha, beta or gamma alumina), silica or silicon carbide, nitride or metallic oxide particles. A minimum Vickers hardness difference of 500 Kg/mm² was between the hard particles and soft-core particles.

In tests performed with slurries having both hard particles and soft-core particles to provide composite particles, the soft-core particles were coated with metallic oxide compounds including copper oxide and manganese oxide. The average size of the soft-core particles can vary from 5 nm to 20 micron. The metallic oxide coatings can vary in thickness from 5 nm to 20 microns and can be continuous or discontinuous. The liquid carrier for the particles was water. The pH of the slurry of varied from 1.0 to 12.0.

To increase the chemical effect of the slurry oxidizers were used. The oxidizers used were compounds such as hydrogen peroxide, ammonium cerium nitrate, periodates, periodic acid, iodates, persulfates, chromates, permanganates, ferricyanides, bromates, perbromates, ferrates, perrhenates, perruthenates. In one specific embodiment, the oxidizing agent comprises a water-soluble transition metal compound that provides transition metal ions, such as Mn (e.g., $KMnO_4$). The concentrations of the oxidizers were varied from 0.001 moles/liter to 3 moles/liter in a water-based solution.

The polishing pressure was varied from 1 psi to 20 psi. The linear velocity was varied from 0.1 m/s to 5 m/s. A polymeric or metallic pad was used for polishing. The polymeric pad comprised a polyurethane or poromeric surface with compressibility varying from 0.1% to 10 percent and Shore D hardness varying from 5 to 99.

The use of disclosed composite particles both with and without individual coatings for the hard and soft-core particles in a slurry has been found to provide several significant advantages. By using diamond hard particles (both uncoated and coated) the ER value was found to be increased from 1.0 to 6 for polishing single crystal silicon carbide and GaN substrate, as well as diamond substrates. Such effect was also observed in other carbides and nitride such as AlN, boron carbide, and WC. Another significant aspect observed was an anisotropic polishing effect in multi-elemental compounds (such as carbides and nitrides). The anisotropic polishing ratio (APR) is defined herein as the ratio of the polishing rates between carbon and non-carbon face (e.g Si and C faces in SiC) in carbide-based compounds and nitrogen and non-nitrogen (e.g., Ga and N faces in GaN) faces in nitride-based compounds.

By using diamond hard particles (both uncoated and coated) in a slurry the ER value can be increased from 1.0 to 10 for single crystal nitride, carbide and diamond polishing. For example the addition of 3 micron alumina soft-core particle to 0.25 micron diamond particle led to increase in ER value to approximately 2.0 for polishing if single crystal SiC substrates. Furthermore, there was a decrease in sub-surface damage and decrease in surface roughness. Moreover, the addition of oxidizers in the pH range increased the ER value to approximately 5.0 to 8.0 with a decrease in roughness and sub-surface damage. Similar improvements were found to be obtained when hard particles (diamond) and soft-core particles (alumina and silica) were coated with metallic oxides such as manganese oxide. As noted above, a significant aspect of disclosed metallic coated particles (hard and/or soft-core particles) was much higher dispersability of the composite particles in the slurry with a further decrease in surface roughness. The APR value was found to increase up to 20 depending on the type of oxidizer used in the polishing process. The use of per-based oxidizers was found to lead to higher APR values, where a per-compound is a compound that includes an element in its highest oxidation state.

The ER value was also found to increase if oxidizers were added to the slurry containing hard particles only. For example if 2% permanganate (an oxidizer) was added to 2% 0.12 micron uncoated and metal oxide coated diamond the ER value was found to increase from 1 to between 3.5 to 4.0 for polishing Si face SiC substrates along with a decrease in roughness and sub-surface damage. FIGS. 4A, 4B and 4C are tables which lists results from Example 2. Furthermore the manganese oxide coated diamond particles showed significantly better dispersability (not shown in FIGS. 4A, 4B and 4C), which was measured by redispersing the slurry with slight agitation.

Example 3

Polishing of Polycrystalline SiC and GaN and Diamond Materials

Polycystalline SiC and GaN and diamond substrates were polished on a single-sided Buehler Rotopol polisher. The hard particles were diamond, with a particle size varying from 4 nm to 20 microns. The hard particles tested also included metal oxide coated diamond particles with a coating thickness varying from 1 nm to 10 microns, which can be continuous or discontinuous. The soft-core particles were alumina (alpha, beta or gamma alumina), silica, silicon carbide, nitride or metallic oxide particles. A minimum Vickers hardness difference of 500 $Kg/mm^2$ was between the hard particles and soft-core particles.

The soft-core particles were coated with metallic oxide compounds such as copper oxide and manganese oxide. The average size of the soft-core particles can vary from 5 nm to 20 micron. The metallic oxide coatings can vary from 5 nm to 20 microns, and can be continuous or discontinuous. More than 2 types of soft-core particles can be used in the slurry. The liquid carrier for the particles was water. The pH of the slurry of varied from 1.0 to 12.0.

To increase the chemical effect oxidizers were used. The oxidizers used were compounds such as hydrogen peroxide, ammonium cerium nitrate, periodates, periodic acid, iodates, persulfates, chromates, permanganates, ferricyanides, bromates, perbromates, ferrates, perrhenates, perruthenates. In one specific embodiment, the oxidizing agent comprises a water-soluble transition metal compound that provides transition metal ions, such as Mn. The concentrations of the oxidizers were varied from 0.001 moles/liter to 3 moles/liter in a water-based solution.

The polishing pressure was varied from 1 psi to 20 psi. The linear velocity was varied from 0.1 m/s to 5 m/s. A polymeric or metallic pad was used for polishing. The polymeric pad n comprised polyurethane or poromeric surface with compressibility varying from 0.1% to 10 percent and Shore D hardness varying from 5 to 99.

The use of composite hard and soft-core particles both with and without individual coatings in disclosed slurries provides several advantages. By using diamond hard particles (both uncoated and coated) the ER value has been found to be increased from 1.0 to 6 for poly-crystalline crystal silicon carbide, diamond and gallium nitride substrates. Such effect was also observed in other carbides and nitride such as AlN, boron carbide and WC. Another significant aspect is anisotropic polishing effect in multi elemental compounds (such as carbides and nitrides) reflected in an APR value.

By using diamond hard particles (both uncoated and coated) in disclosed slurries the ER value can be increased from 1.0 to 10 for single crystal nitride, carbide and diamond polishing. For example the addition of 3 micron alumina soft-core particle to 0.25 micron diamond particle was found to lead to increase in ER value to approximately 2.0 for polishing for poly crystal SiC substrates. Furthermore there was a decrease in sub-surface damage and decrease in surface roughness. Moreover, the addition of oxidizers in the pH range increased the ER value to approximately 5.0 to 8.0 with decrease in roughness and sub-surface damage. Similar improvements were obtained when hard particles (diamond) and soft-core particles (alumina and silica) were coated with metallic oxides such as manganese oxide. A significant aspect of metallic coated particles was much higher dispersability of the composite particles in the slurry with further decrease in surface roughness. The APR value was found to increase up to 20 depending on the type of oxidizer used in the polishing process. The use of per-based oxidizers was found to lead to higher APR values.

The ER value was also found to increase if oxidizers were added to the slurry containing hard particles only. For example if 2% permanganate was added to 2% 0.12 micron uncoated and metal oxide coated diamond the ER value was found to increase from 1 to between 3.5 to 4.0 when Si face SiC substrates with decrease in roughness and sub-surface damage. Furthermore the manganese oxide coated diamond particles showed significantly better dispersability. FIGS. 5A, 5B and 5C are tables which lists results from Example 3.

Example 4

Polishing of Multiphase Diamond-Based Materials

Composite particle-based slurries were applied to polish polycrystalline multiphase diamond-based materials including at least one diamond phase. Examples of such materials include diamond/cobalt composites and SiC/diamond composites.

The hard particles were diamond with particle an average size varying from 4 nm to 20 microns. The hard particles tested also included metal oxide coated diamond particles with a coating thickness varying from 1 nm to 10 microns, which can be continuous or discontinuous. The soft-core particles were either alumina (alpha, beta or gamma alumina), silica, silicon carbide, nitride or metallic oxide particles. A minimum Vickers hardness difference of 500 $Kg/mm^2$ was between the hard and soft-core particles.

The soft-core particles were coated with metallic oxide compounds such as copper oxide and manganese oxide. The average size of the soft-core particles can vary from 5 nm to 20 micron. The thickness of the metallic oxide coatings can vary from 5 nm to 20 microns, and be continuous or discontinuous. More than 2 types of soft-core particles can be used in the slurry. The liquid carrier for the particles was water. The pH of the slurry of varied from 1.0 to 12.0. To increase the chemical effect oxidizers were used. The oxidizers used were compounds such as hydrogen peroxide, ammonium cerium nitrate, periodates, periodic acid, iodates, persulfates, chromates, permanganates, ferricyanides, bromates, perbromates, ferrates, perrhenates, perruthenates. In one specific embodiment, the oxidizing agent comprises a water soluble transition metal compound that provides transition metal ions, such as Mn. The concentrations of oxidizers were varied from 0.001 Moles/liter to 3 Moles/liter in a water-based solution.

The polishing pressure was varied from 1 psi to 20 psi. The linear velocity was varied from 0.1 m/s to 5 m/s. A polymeric, metallic pad was used for polishing. The polymeric pad can comprise a polyurethane or poromeric surface with compressibility varying from 0.1% to 10 percent and Shore D hardness varying from 5 to 99. In addition diamond impregnated metal pads were also used with the slurry containing either composite particles or a hard particles only slurry.

The use of composite particles including hard particles and soft-core particles both with and without individual coatings in disclosed slurries was found to provide several advantages. By using diamond hard particles (both uncoated and coated) the ER value was found to be increased from 1.0 to 6 for single crystal silicon carbide, diamond and gallium nitride substrates. Such effect was also observed in other carbides and nitride such as AlN, boron carbide and WC. By using diamond hard particles (both uncoated and coated) the ER value was found to be increased from 1.0 to 10 for single crystal nitride, carbide and diamond polishing. Furthermore there was a decrease in sub-surface damage and decrease in surface roughness.

Moreover, the addition of oxidizers in the pH range increased the ER value to approximately 5.0 to 8.0 with decrease in roughness and sub-surface damage. Similar improvements were obtained when hard particles (diamond) and soft-core particles (alumina and silica) were coated with metallic oxides such as manganese oxide. An unusual aspect of metallic coated particles was much higher dispersability of the composite particles in the slurry with a further decrease in surface roughness. The APR value was found to increase up to 20 depending on the type of oxidizer used in the polishing process. The use of per-based oxidizers was found to lead to higher APR values. FIG. 6 is a table which lists results from Example 4.

While various embodiments of the invention have been described above, it should be understood that they have been presented by way of example only, and not limitation. Numerous changes to the disclosed embodiments can be made in accordance with this Disclosure without departing from the spirit or scope of the subject matter disclosed herein. Thus, the breadth and scope of this Disclosure should not be limited by any of the above described embodiments. Rather, the scope of this Disclosure should be defined in accordance with the following claims and their equivalents.

Although this Disclosure has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application.

The invention claimed is:
1. A method of chemical mechanical polishing (CMP), comprising
   providing a slurry
   comprising a plurality of composite particles dispersed in a water-based carrier that comprise a plurality of hard diamond particles on an outer surface of a soft-core particle comprising an inorganic material wherein said soft-core particle comprise alumina, boron carbide, boron nitride, or silicon carbide, and wherein an average size of said soft-core particle is at least 1 µm
   placing a substrate having a substrate surface with a hardness greater than a Mohs number of 6 or a Vickers hardness greater than 1,000 kg/mm into a CMP apparatus having a rotating polishing pad, and
   performing CMP with said rotating polishing pad and said slurry to polish said substrate surface.

2. The method of claim 1, wherein said substrate surface comprises sapphire, single crystal SiC, or single crystal GaN.

3. The method of claim 1, wherein said slurry has a pH between 9 and 14.0 or said slurry has a pH between 0.01 and 4.

4. The method of claim 1, wherein said slurry further comprises alkali ions in a concentration between 0.01 gm/liter and 200 gm/liter.

5. The method of claim 1, wherein said slurry further comprises at least one oxidizer and at least one surfactant.

6. A chemical mechanical polishing (CMP) slurry, comprising:
a plurality of composite particles dispersed in a water-based carrier that comprise a plurality of diamond particles on an outer surface of a soft-core particle comprising an inorganic material,
and
wherein said soft-core particle comprise alumina, boron carbide, boron nitride, or silicon carbide, and
wherein an average size of said soft-core particle is at least 1 μm.

7. The slurry of claim 6, wherein at least one of said plurality of diamond particles and said soft-core particle include a metallic oxide compound coating thereon.

8. The slurry of claim 6, wherein said slurry has a pH between 9 and 14 or said slurry has a pH between 0.01 and 4.

9. The slurry of claim 6, wherein said slurry further comprises alkali ions in a concentration between 0.01 gm/liter and 200 gm/liter.

10. The slurry of claim 6, wherein said slurry further comprises at least one oxidizer and at least one surfactant.

11. The slurry of claim 10, wherein said oxidizer comprises a per-based compound, and wherein said plurality of diamond particles have an average size <1 μm, and a pH of said slurry is <7.0.

12. The slurry of claim 6, wherein said soft-core particle comprises alumina.

13. The slurry of claim 7, wherein both said plurality of diamond particles and said soft-core particle include said metallic oxide compound coating thereon.

\* \* \* \* \*